United States Patent [19]
Dodabalapur et al.

[11] Patent Number: 5,814,416
[45] Date of Patent: Sep. 29, 1998

[54] WAVELENGTH COMPENSATION FOR RESONANT CAVITY ELECTROLUMINESCENT DEVICES

[75] Inventors: Ananth Dodabalapur, Millington; Timothy Mark Miller, New Providence; Lewis Josiah Rothberg, Morristown, all of N.J.

[73] Assignee: Lucent Technologies, Inc., Murray Hill, N.J.

[21] Appl. No.: 630,237

[22] Filed: Apr. 10, 1996

[51] Int. Cl.$^6$ .................................................. H05B 33/00
[52] U.S. Cl. .......................... 428/690; 428/917; 313/504; 359/838; 385/47; 385/131
[58] Field of Search ..................................... 428/690, 917; 313/504; 359/838; 385/47, 131

[56] References Cited

U.S. PATENT DOCUMENTS 5,405,710  4/1995  Dodabalapur et al. .................. 428/690

OTHER PUBLICATIONS

A. Dodabalapur et al., "Microcavity Effects In Organic Semiconductors", 64 (19) Appl. Phys. Lett. 2488 (May 9, 1994).
A. Dodabalapur et al., "Electroluminescence From Organic Semiconductors In Patterned Microcavities", 30 Elect. Lett. 1000 (1994).
A. Dodabalapur et al., "Color Variation with Electroluminescent Organic Semiconductors In Multimode Resonant Cavities", 65 (18) Appl. Phys. Lett. 2308.
Nakayama et al., "Organic Photo– And Electroluminescent Devices With Double Mirrors", 73 (5) Appl. Phys. Letter 594 (Aug. 2, 1993).
G. Bjork and O. Nilsson, "A New Exact and Efficient Numerical Matrix Theory of Complicated Laser Structures: Properties of Asymmetric Phase–Shifted DFB Lasers", Jrnl. of Lightwave Technology, vol. LT–5, No. 1, Jan. 1987, pp. 143–146.
R. Evans, "An Introduction to Color", pp. 205–212, John Wiley & Sons, 1948.
K. Murata, "Developers Continue to Refine Blue LED Technologies for Display Use", Display Devices, pp. 47–50, 1992.
M. Bain and E. Wolf, "Principles of Optics", Pergamon Press, Norwich 1975 (5th Edition) pp. 59–70.
Vredenberg et al., "Controlled Atomic Spontaneous Emission from $Er^{3+}$ in a Transparent $Si/SiO_2$ Microcavity", Physical Review Letters 71, 517 (1993).

Primary Examiner—Charles Nold

[57] ABSTRACT

Disclosed is a microcavity organic light emitter having reduced variation in emission spectra per change in viewing angle. In an illustrative embodiment, a microcavity EL device comprises a microcavity layer structure stacked on a symmetric, non-planar surface of a substrate. The microcavity layer structure includes at least a first reflective layer on the non-planar substrate surface, a second reflective layer and an active layer having organic material capable of electroluminescence between the first and second reflective layers. The non-planar surface may be a shallow cone, frustum, a dome-like surface, or a combination thereof.

20 Claims, 11 Drawing Sheets

| LAYER | THICKNESS (nm) | INDEX OF REFRACTION |
|---|---|---|
| 24 (Al) | 100 | (.83+i1.5)* |
| 22 (Alq) | 90 | 1.71 |
| 20 (TAD) | 100 | 1.71 |
| 18 (ITO) | 55 | 2.08 |
| 16 (FILLER-$Si_xN_y$) | 60 | 1.92 |
| 14a, c, e ($Si_xN_y$) | 62 | 2.20 |
| 14b, d, f ($SiO_2$) | 92 | 1.50 |

*=REFLECTIVITY

FIG. 2

| LAYER | THICKNESS (nm) | INDEX OF REFRACTION |
|---|---|---|
| 24 (Al) | 100 | (.83+i1.5)* |
| 22 (Alq) | 90 | 1.71 |
| 20 (TAD) | 100 | 1.71 |
| 18 (ITO) | 55 | 2.08 |
| 16 (FILLER-$Si_xN_y$) | 60 | 1.92 |
| 14a, c, e ($Si_xN_y$) | 62 | 2.20 |
| 14b, d, f ($SiO_2$) | 92 | 1.50 |

*=REFLECTIVITY

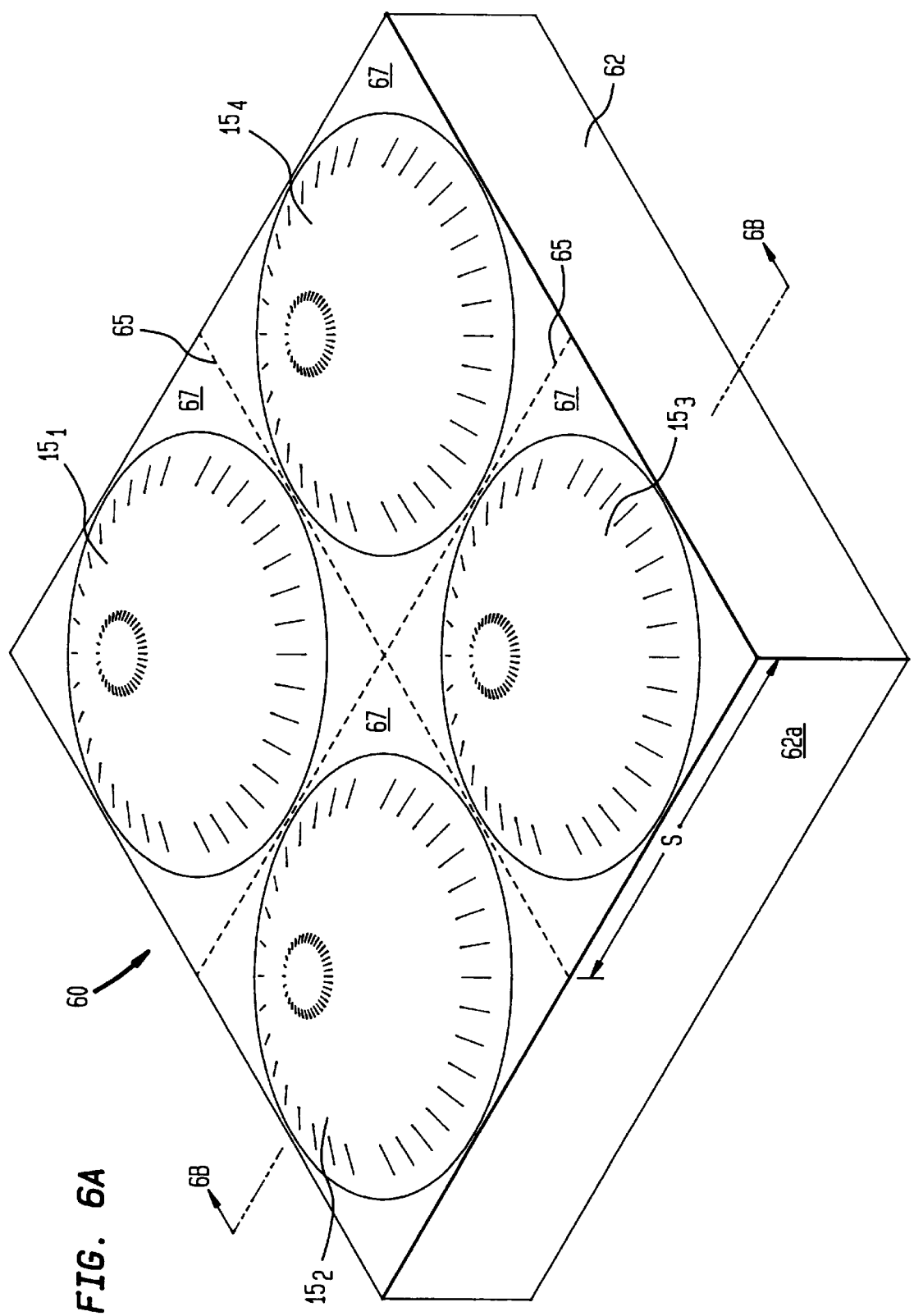

WAVELENGTH COMPENSATION FOR RESONANT CAVITY ELECTROLUMINESCENT DEVICES

FIELD OF THE INVENTION

The present invention relates to resonant cavity, organic electroluminescent devices.

BACKGROUND OF THE INVENTION

Resonant cavity electroluminescent devices (also called resonant cavity light emitting devices or RCLEDs), and, specifically, microcavity organic light emitters, are known in the art. An RCLED is referred to as "organic" when the electroluminescent ("EL") material used therein is organic. As its name implies, a microcavity structure has a cavity platform on the order of micrometers.

Generally, the fluorescence spectrum of some electroluminescent organic materials are broad, in some cases covering the entire visible region. Manipulation of the spontaneous emission rates and profiles of luminescent systems can be accomplished by incorporating them into structures, such as microcavity structures, that alter their nominal free space density and photon states. A planar microcavity structure can tailor the spontaneous emission of organic thin films. Thus, a single emissive layer of organic material in a planar microcavity structure, for example, can be used to construct red, green or blue light emitters. This is known in the art and described in further detail in A. Dodabalapur, et al., "Microcavity Effects In Organic Semiconductors," 64(19) Appl. Phys. Lett. 2486 (May 9, 1994) ("Dodabalapur I"); A. Dodabalapur, et al., "Electroluminescence From Organic Semiconductors In Patterned Microcavities," 30 Elect. Lett. 1000 (1994) ("Dodabalapur II"); A. Dodabalapur, et al., "Color Variation With Electroluminescent Organic Semiconductors In Multimode Resonant Cavities," 65(18) Appl. Phys. Lett. 2308 (Oct. 31, 1994) ("Dodabalapur III") and U.S. Pat. No. 5,405,710 (the "Dodabalapur patent"), all of which are incorporated herein by reference.

In brief, narrowing of the bandwidth of the emitted light to a "single" color in a planar microcavity structure, for example, is due to the enhancement by the reflective layers incorporated into the device. This is described in Nakayama, et al., "Organic Photo- And Electroluminescent Devices With Double Mirrors," 63(5) Appl. Phys Letter 594 (Aug. 2, 1993), which is also incorporated herein by reference. The wavelength of the emitted light is further determined by the optical thickness (also called optical length) of the cavity, which can be manipulated by changing the thickness of the layers comprising the cavity. Other optical properties may be changed to create this effect, such as the index of refraction of the layers, or the center wavelength of the stop band of a quarter wave stack used as a reflective surface. As disclosed in the Dodabalapur patent, a filler layer of appropriate thickness may be incorporated into the microcavity structure to control the emitted wavelength. By using different thicknesses for the filler layer in distinct regions of a planar microcavity structure, a single emissive layer of organic material can be used to construct red, green or blue light emitting elements in the distinct regions.

Consequently, microcavity organic light emitting devices (LEDs) employing a variable filler layer are advantageous since they can be used to create a full color display without the need to combine different emissive materials. Once it is decided what layer or property is to be varied to achieve the particular color of the particular light emitter, only that layer or property need be varied to obtain the desired color. All other layers comprising the particular microcavity, including the organic EL layer, will remain constant for the different color emitters.

SUMMARY OF THE INVENTION

The origins of the present invention stem from a recognition that, in general, resonant cavity electroluminescent devices and, specifically, microcavity organic light emitters, have an emission spectrum that undesirably varies as a function of the viewing angle from the device. That is, a blue shift in the emitted wavelength (i.e., a shift towards shorter wavelengths) occurs with an increase in the viewing angle from the normal to the emitting surface of the device. In microcavity devices, the distance between standing wave nodes of incident and reflected waves decrease with an increase in viewing angle. Thus, to match the characteristic dimension of the cavity requires shorter wavelengths. Accordingly, the peak wavelength of a typical microcavity organic light emitter may decrease by about 25 to 50 nm with a 45° shift in viewing angle from the normal to the plane of light emission. The blue shift limits the use of microcavity LEDs in a number of important applications, such as displays, where visual perception and impressions are important.

Accordingly, the present invention overcomes the above-noted problems of prior art microcavity LEDs by providing a microcavity organic light emitter that reduces or minimizes the variation in the wavelength of light emitted per change in viewing angle. In an illustrative embodiment, a microcavity electroluminescent device comprises a substrate having a surface with a multiplicity of predetermined regions with at least one of the regions comprising a non-planar surface feature, and a microcavity layer structure stacked on the non-planar surface feature. The microcavity layer structure includes at least a first reflective layer on the non-planar substrate surface feature, a second reflective layer and an active layer having organic material capable of electroluminescence between the first and second reflective layers. The substrate may have a planar surface opposite its symmetric, non-planar surface feature, and the symmetric, non-planar surface of the substrate may be a cone extending away from the opposite planar surface. The cone may be a right circular cone with wedge angle between 8° and 15°. Alternatively, the non-planar surface feature may be a frustum, a dome-like surface, or a combination thereof. The electroluminescence from opposing regions of the non-planar surface add in the far field in a manner such as to reduce the wavelength variation of the emitted light with viewing angle, as compared to planar microcavity LEDs.

A display can be fabricated with a plurality of microcavity LEDs in accordance with the present invention fabricated on a common substrate. The substrate has a planar surface on one side and an opposing surface having a plurality of projecting non-planar surface features. The LEDs are fabricated on the projecting non-planar surface features, such that each forms a sub-pixel. Each pixel of the display comprises, e.g., at least three adjoining sub-pixels of different colors.

BRIEF DESCRIPTION OF THE DRAWINGS

The features of the present invention will be better understood and become readily apparent by referring to the following detailed description of an illustrative embodiment of a microcavity organic light emitter, in conjunction with the accompanying drawings, in which:

FIG. 2 shows a table with exemplary microcavity layer materials and thicknesses;

FIG. 6A is a perspective view of a portion of a display in accordance with the present invention;

DETAILED DESCRIPTION OF THE PREFERRED EMBODIMENT

Figure 1:
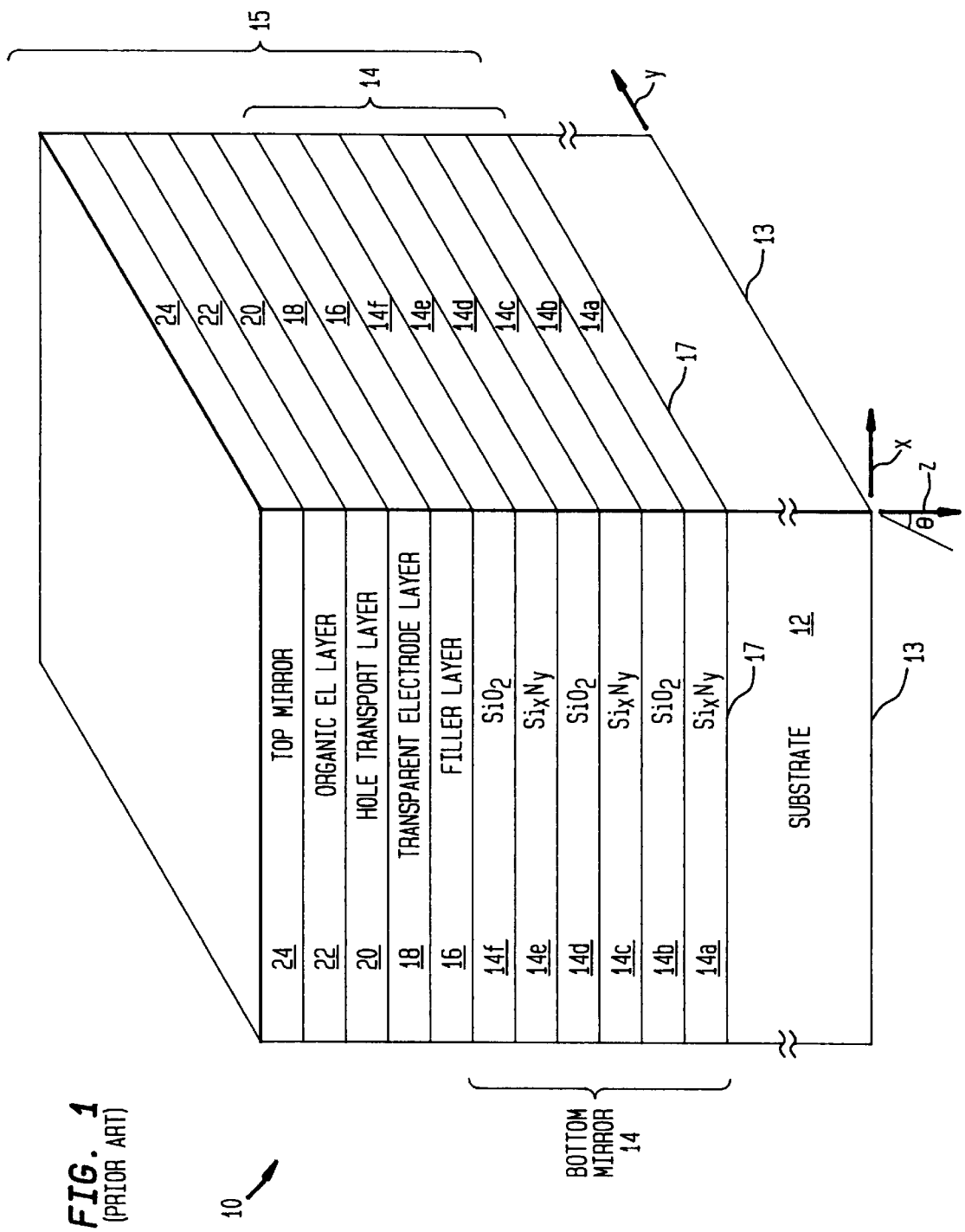
FIG. 1 is a representative illustration of the layers comprising a typical microcavity light emitter.

FIG. 1 presents a representative perspective view of a typical microcavity organic light emitter 10 as known in the art. Emitter 10 has a generally solid rectangular geometry and can be used as a sub-pixel or pixel of a flat display. Emitters such as this are also described in Dodabalapur I–III and the Dodabalapur patent referred to above. Descriptions of how to construct the emitters through various deposition, spin coating and masking, which is known in the art, is likewise described in these references. Mathematical modeling of the layer system, allowing construction of emitters of a chosen wavelength, is also described.

Light emitter 10 is comprised of an organic microcavity layer structure 15 formed on a first planar surface 17 of a substrate 12. The substrate 12 has a second planar surface 13 opposite planar surface 17, through which light generated by the microcavity structure 15 is emitted. A significant difference between illustrative embodiments of the present invention to be described below and light emitter 10 is that substrate 12 is replaced by a substrate having a non-planar surface upon which the microcavity structure is formed. In these embodiments, the microcavity layer structure is of a generally uniform thickness along the entire non-planar surface of the substrate. As such, the following discussion of the layer composition of the microcavity structure 15 is applicable to both the prior art planar light emitter 10 and to the light emitters of the present invention to be described below.

At a minimum, microcavity structure 15 is comprised of a bottom mirror layer 14 which is a multilayer dielectric stack, an organic electroluminescent (EL) layer 22 (the "active" layer), a top metallic mirror 24 and some means for facilitating application of an electric field across EL layer 22 to cause it to emit light through the bottom mirror 14. Optionally, however, the active layer can comprise, in addition to the organic EL layer 22, one or more additional layers, e.g., a hole transport layer 20 and/or an electron/hole blocking layer (not shown) between EL layer 22 and top mirror 24. The EL material of layer 22 can be single layer, or it can be two or more layers that differ in their emission characteristics. Each of the EL material layers can be doped or un-doped.

The substrate 12, as well as the substrates having non-planar surfaces employed in embodiments of the invention described below, is substantially transparent to radiation of the relevant wavelength. By "substantially transparent" we mean herein that, over the relevant distance, the attenuation of radiation of the relevant wavelength is typically not more than 25%. Exemplary substrate materials are fused silica, glass, sapphire, quartz, or transparent plastic such as poly (ethylsulfone).

The multilayer mirror 14 consists of alternating layers of substantially non-absorbing materials of appropriately chosen thickness (typically $\lambda/4$). Such mirrors are well known. Its reflectivity depends in a known way on the number of layer pairs and the refractive index of the materials used. Exemplary material pairs are $SiO_2$ and $Si_xN_y$; $SiO_2$ and $SiN_x$; and $SiO_2$ and $TiO_2$. In FIG. 1, mirror 14 is shown by way of example to consist of alternating $SiO_2$ and $Si_xN_y$ layers 14a–14f, i.e., three layer pairs. It is understood that more or fewer pairs can be used.

The organic EL layer 22 is the source of the light emission. Exemplary EL materials are tris(8-hydroxyquinoline)aluminum(Alq), perylene derivatives, anthracene, poly(phenylene vinylenes), oxadiazole and stilbene derivatives. EL materials optionally can be doped, exemplary with coumarine, a DCM, or a rhodamine derivative, in order to tailor the EL spectrum of the material and/or enhance the efficiency of the device. The EL material can consist of multiple layers including some which are doped as described in Jordan et al., Appl. Phys. Lett. 68, 1192 (1996).

Optionally, hole transport layer 20 is included, which can be any substantially transparent material that can facilitate the transport of holes to EL layer 22, where electron-hole recombination takes place. Examples of suitable materials are diamine (e.g., triphenyl diamine or TAD) and poly (thienylene vinylene).

An (optional) electron transport layer (not shown) may be employed between EL layer 22 and top mirror 24. The electron transport layer can be any substantially transparent material that can facilitate electron transport from the top mirror to the EL layer. Exemplary of such materials are 2-(4-Biphenyl)-5-phenyl-1, 3, 4-oxadiazole (PBD), butyl PBD, or either of these doped in an inert polymer such as poly(methyl methacrylate) (PMMA) or a poly(carbonate).

The top metallic mirror layer 24 injects electrons into the adjacent layer. Exemplary reflective materials are Al, Ag or Au, or alloys such as Mg/Al, Mg/Ag, or Li/Al. Mirror layer 24 is patterned in display applications, both in the prior art and in the embodiments herein, in order to separate adjacent LEDs from one another. As such, voltages can be selectively applied to the top metallic mirrors of the individual LEDs to produce electroluminescence.

Appropriate choice of EL material can make possible elimination of one (possibly both) of the hole transport layer and the electron transport layer. For instance, Alq can function both as EL material and electron transport medium, and poly(phenylene vinylene) can function both as EL material and hole transport medium.

An (optional) filler layer 16 can be any substantially transparent material that is chemically stable under the manufacturing and operating conditions that can be patterned by an appropriate technique. Exemplary filler materials are transparent polymers (e.g., polyimide) or transparent dielectrics (e.g., $Si_xN_y$ or $SiO_2$).

Preferably, a transparent (or semitransparent) electrode layer 18 is employed as the means for facilitating application of an electric field across the active layer or layers. Exemplary choices for electrode layer 18 are: indium tin oxide (ITO); another conducting oxide such as GaInO$_3$ or Zn$_{1.2}$In$_{1.9}$Sn$_{0.1}$O$_x$; a conducting polymer such as polyaniline; or, a thin layer (e.g., about 10 angstroms) of metal (e.g., Au or Al).

The electric field across the EL layer, which causes electroluminescence, is preferably created by applying a voltage between the top mirror layer 24 and the electrode layer 18. Electroluminescence is observed when approximately 10 volts is applied between these layers. The device typically operates at about 10% internal quantum efficiency (i.e., photons per injected electron).

To facilitate the manufacturing of a large number of light emitters of several, (e.g., three) selective colors on a common substrate, such as in display applications, the filler layer 16 is preferably used as the layer which controls the color emitted. As such, the same organic EL material can be used throughout the display to produce the different colors. This technique was described in the Dodabalapur patent and is also applicable to the light emitters of the present invention described below. Basically, the thickness of the filler layer is used to manipulate the total optical length of the cavity and, thus, the principal emission wavelengths. (As noted in the Dodabalapur patent, for example, the thicknesses and refractive indices of the other layers of microcavity layer structure 15 may also be tailored to set the total optical length of the cavity. The "cavity" itself is defined by its optical length).

FIG. 2 tabulates exemplary thicknesses and materials which can be used for the various layers of the emitter 10 of FIG. 1. A typical index of refraction for each layer is also given. This particular configuration results in a yellow emission normal to the planar bottom surface 13 of substrate 12 (i.e., along the z axis of FIG. 1).

Figure 3:
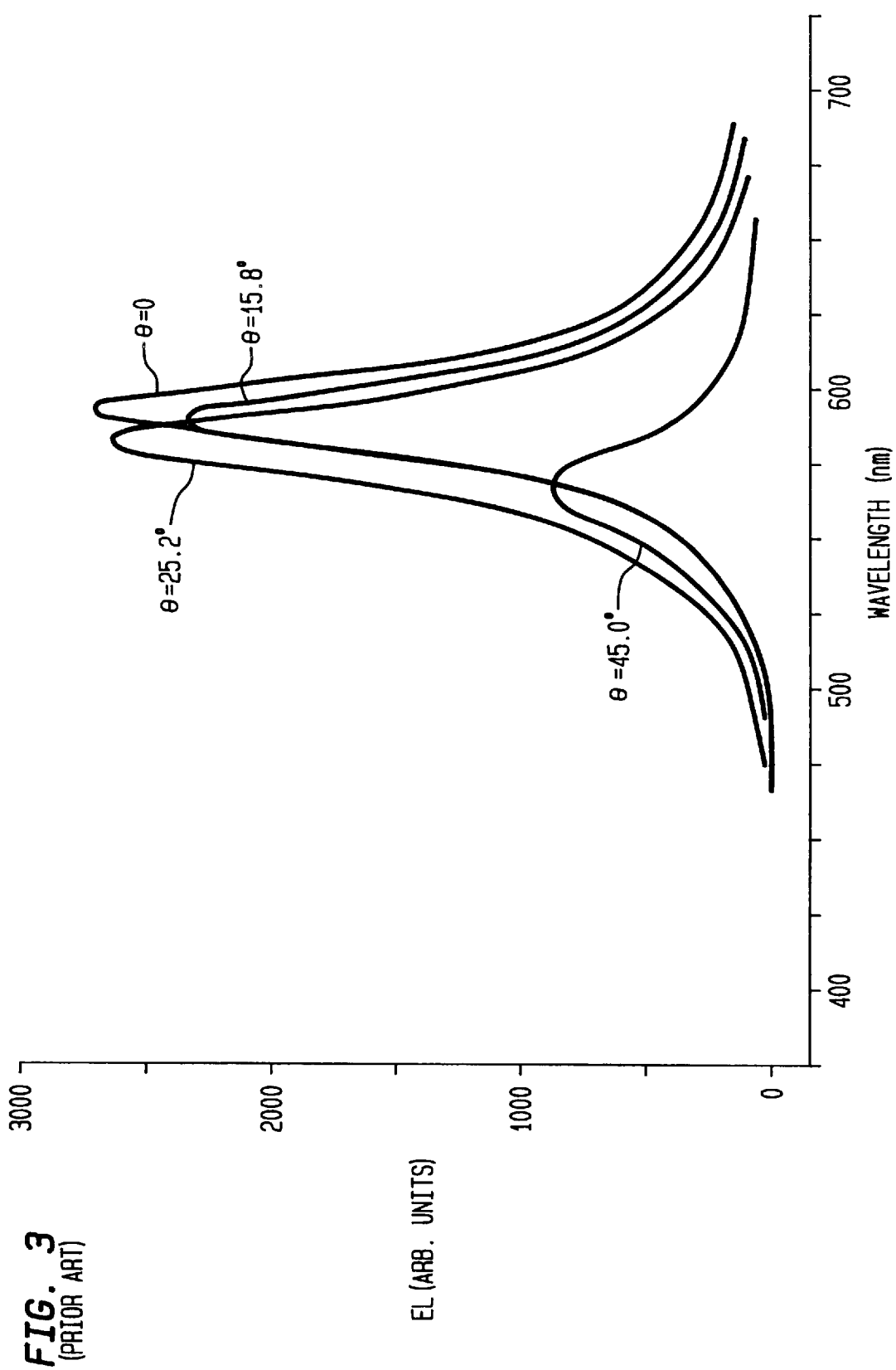
FIG. 3 is a graph of the measured intensity of the emitted light versus wavelength for the light emitter of FIGS. 1–2 for a number of viewing angles.

Shown in FIG. 3 are curves of the measured intensity of the electroluminescence (EL) emitted by the planar microcavity emitter 10 of FIG. 1 having the layer characteristics given in FIG. 2. Electroluminescence is plotted versus wavelength for various viewing angles θ, where θ represents the far field angle from the normal axis z to the substrate 12 (see FIG. 1). In the normal direction (θ=0°), a narrow peak is observed at approximately 590 nm, with a spectral width of approximately 25 nm. The peak emission wavelength becomes shorter as the viewing angle θ increases. Thus, in the example, the peak emission wavelength shifts from about 590 nm at θ=0° to 565 nm at θ=45°, a "blue shift" of 25 nm. Also, the bandwidth of the wavelength increases, and the peak intensity decreases, with increasing viewing angle. The peak EL intensity at θ=45° is approximately one third of the value observed at θ=0°. It is noted that an approximation for the EL intensity and emission wavelengths can be obtained analytically, with close agreement with the measured results of FIG. 3. This analysis will be discussed in detail below.

In accordance with the present invention, emission wavelength variation with viewing angle is reduced by providing a microcavity structure on a symmetric, non-planar surface of a substrate. The non-planar surface is selected to reduce or minimize such emission wavelength variation.

Figure 4A:
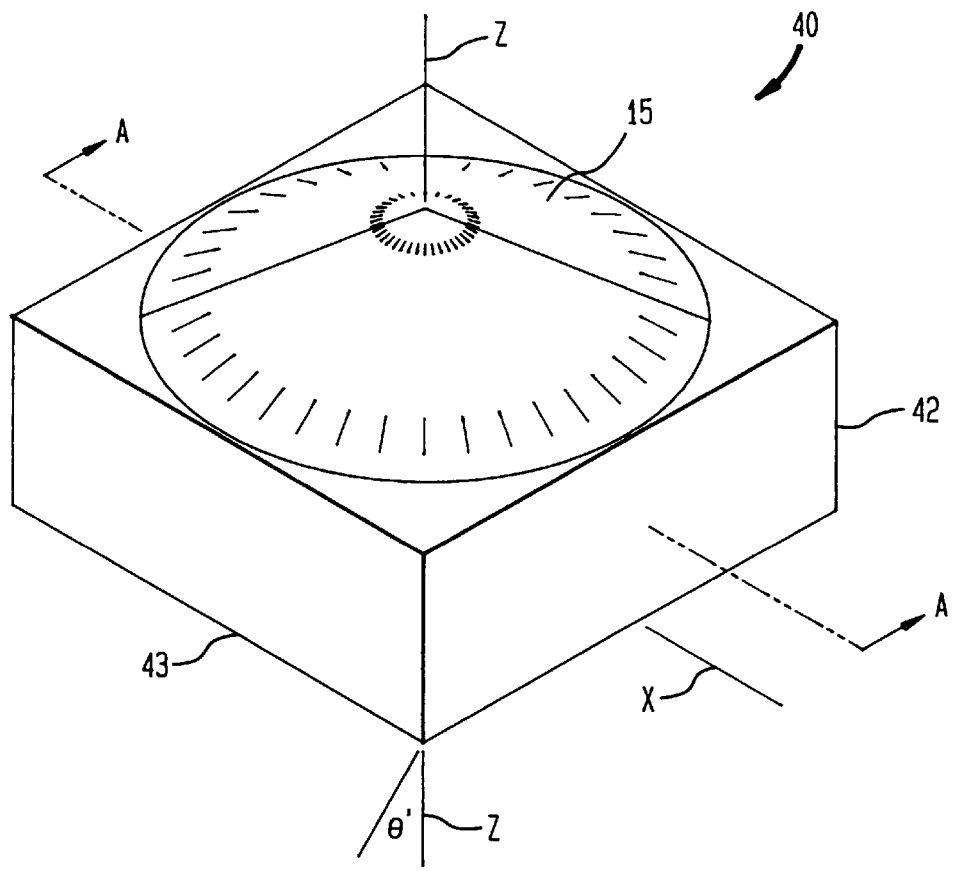
FIGS. 4A and 4B are perspective and cross-sectional views, respectively, of a conical type light emitter in accordance with the present invention.
Figure 4B:
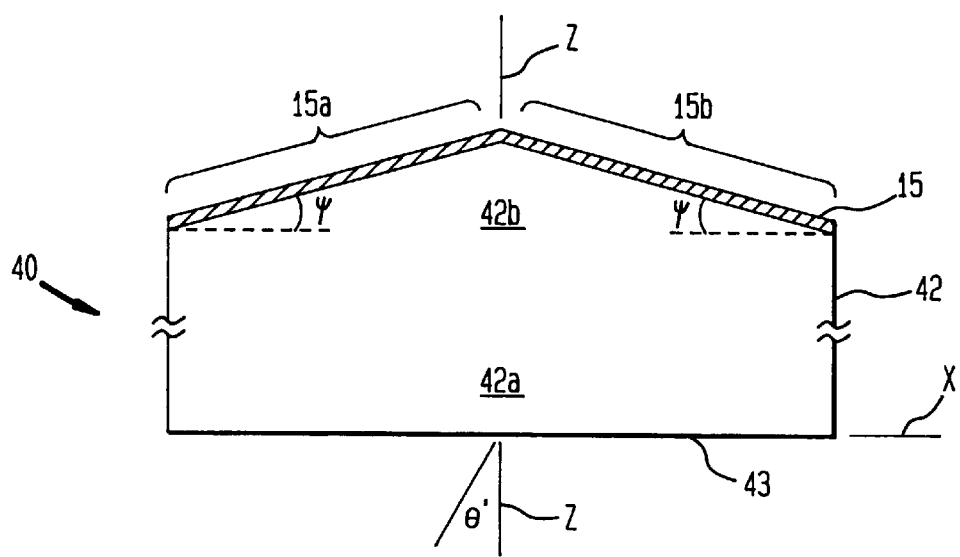

In a first embodiment, this non-planar surface is conical. FIG. 4A is a perspective view of a conical type microcavity light emitter 40 in accordance with the present invention. A substrate 42, e.g., fused silica, has a solid rectangular base portion unitary with a conical portion. A uniform microcavity layer structure 15 of light emitting device layers is formed on the conical portion of substrate 42. The conical portion is preferably a right circular cone. As such, the emitter 40 is symmetric about a Z axis running through the apex of the cone. As shown in FIG. 4B, which is the view AA of FIG. 4A, the base portions and conical portions of substrate 42 are designated as 42a and 42b, respectively. Light is emitted through a planar bottom surface 43 of base portion 42a. Conical portion 42b has a shallow wedge angle ψ which may be in the range of 8°–15°. Viewing angle θ' from the z axis (normal to surface 43) is analogous to viewing angle θ of the planar LED 10 discussed above (FIG. 1).

Layered structure 15 is preferably formed on the conical portion 42b by means of evaporation sublimation of the successive layers. This process allows the layers to be formed with substantially uniform thickness over the entire conical surface. (It is noted that it may be possible to form layered structure 15 on conical portion 42b by spin casting from a solution). Layered structure 15 is thus analogous to that used for the planar LED of FIG. 1, and forms a microcavity structure, with the thickness and index of refraction of each layer influencing the emission spectrum normal to each region of the microcavity structure 15.

Wavelength variation of emitted light as a function of viewing angle θ' is reduced with light emitter 40 as compared to the variation exhibited by planar light emitters such as that shown in FIG. 1. This wavelength variation reduction is a result of the addition, in the far field, of the light spectra originating from the various regions of the conical structure. Referring to FIG. 4B, the far field light emission at each angle θ' in the x–z plane can be roughly approximated as an addition of the light emitted by opposing halves 15a and 15b of the LED layer structure 15. Thus, for example, sections 15a and 15b can be envisioned as two planar microcavity LEDs squinted towards one another, each having emission characteristics similar to that shown in FIG. 3. As such, one can ascertain from the geometry that the addition of the spectra will provide diminished wavelength variation with viewing angle. Because of the symmetry of the device, the far field spectrum in all planes (as well as the x–z plane) will be essentially the same. The conical case is a relatively easy one to model analytically, since the far field pattern can essentially be obtained by averaging the contributions from both halves of the cone in each plane.

Figure 5A:
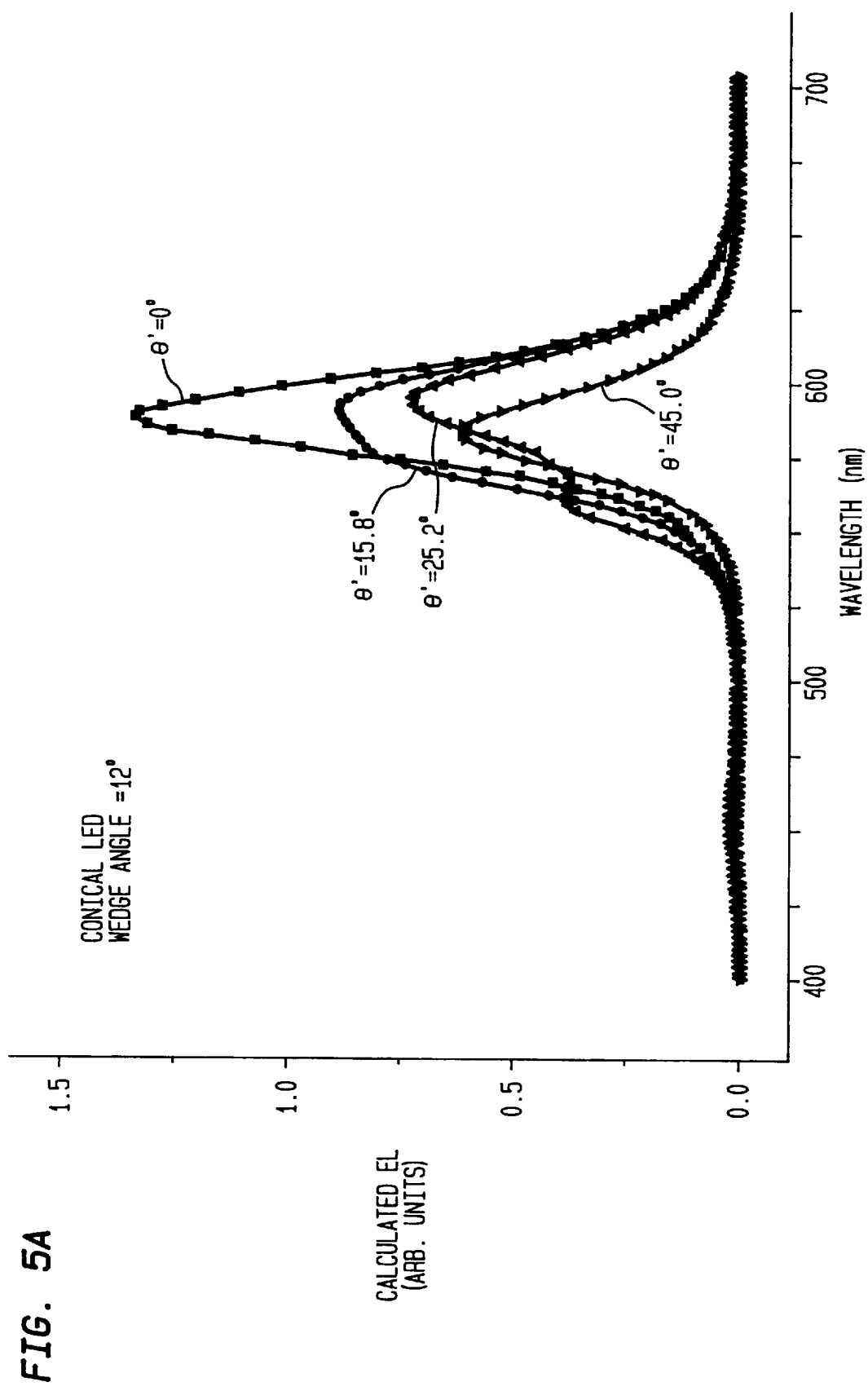
FIG. 5A depicts calculated intensity of emitted light versus wavelength for the light emitter defined by FIGS. 2 and 4 for a number of viewing angles.
Figure 5B:
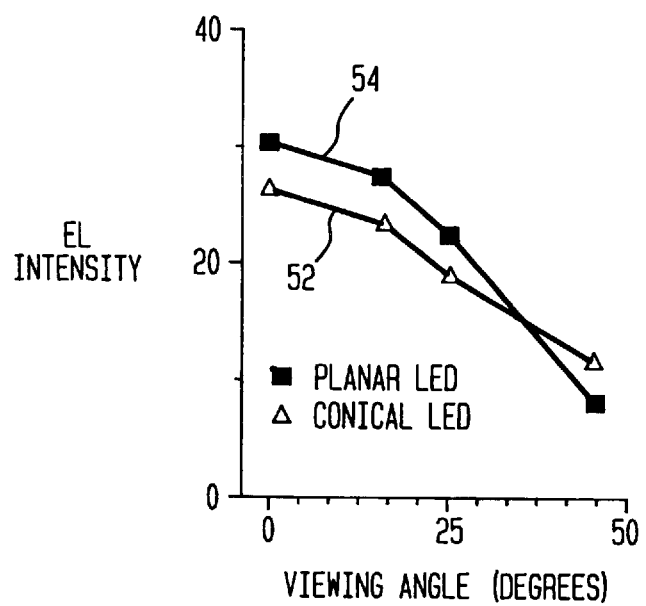
FIGS. 5B and 5C illustrate EL performance comparisons between a planar LED and a conical LED.

Referring to FIG. 5A, computed EL intensity of the conical light emitter 40 vs. wavelength is plotted for viewing angles θ' of 0°, 15.8°, 25.2° and 45°, for the case of light emitter 40 having analogous layer characteristics to those of FIG. 2. Thus, a 90 nm thick Alq layer is used for EL layer 22, and so forth. The substrate 42 is assumed to be fused silica with an index of refraction of 1.5 and a base portion 42a thickness of 1–10 millimeters. The wedge angle ψ of the conical portion is 12° for this case. The curves indicate that the emission wavelength variation with viewing angle is reduced as compared to the prior art light emitter 10 of FIG. 1. The principal emission wavelength at θ'=0° is approximately 588 nm—this shifts slightly higher to about 594 nm as θ' reaches 25.2°, and then lower to about 583 nm for a θ' of 45°. Hence, the LED 40 exhibits a peak emission wavelength shift of +6/−5 nm between a viewing angle θ' of 0° and 45°, as compared to a −25 nm shift for the prior art case of FIGS. 1–3. As shown in FIG. 5B, the peak EL intensity variation with viewing angle is also reduced with the conical LED 40, at the expense of lower EL intensity normal to the device. Curve 54 is a plot of peak EL intensity vs. viewing angle for the LED 10 of FIGS. 1–3, while curve 52 is for the conical LED 40 with the same microcavity layer structure 15.

Figure 5C:
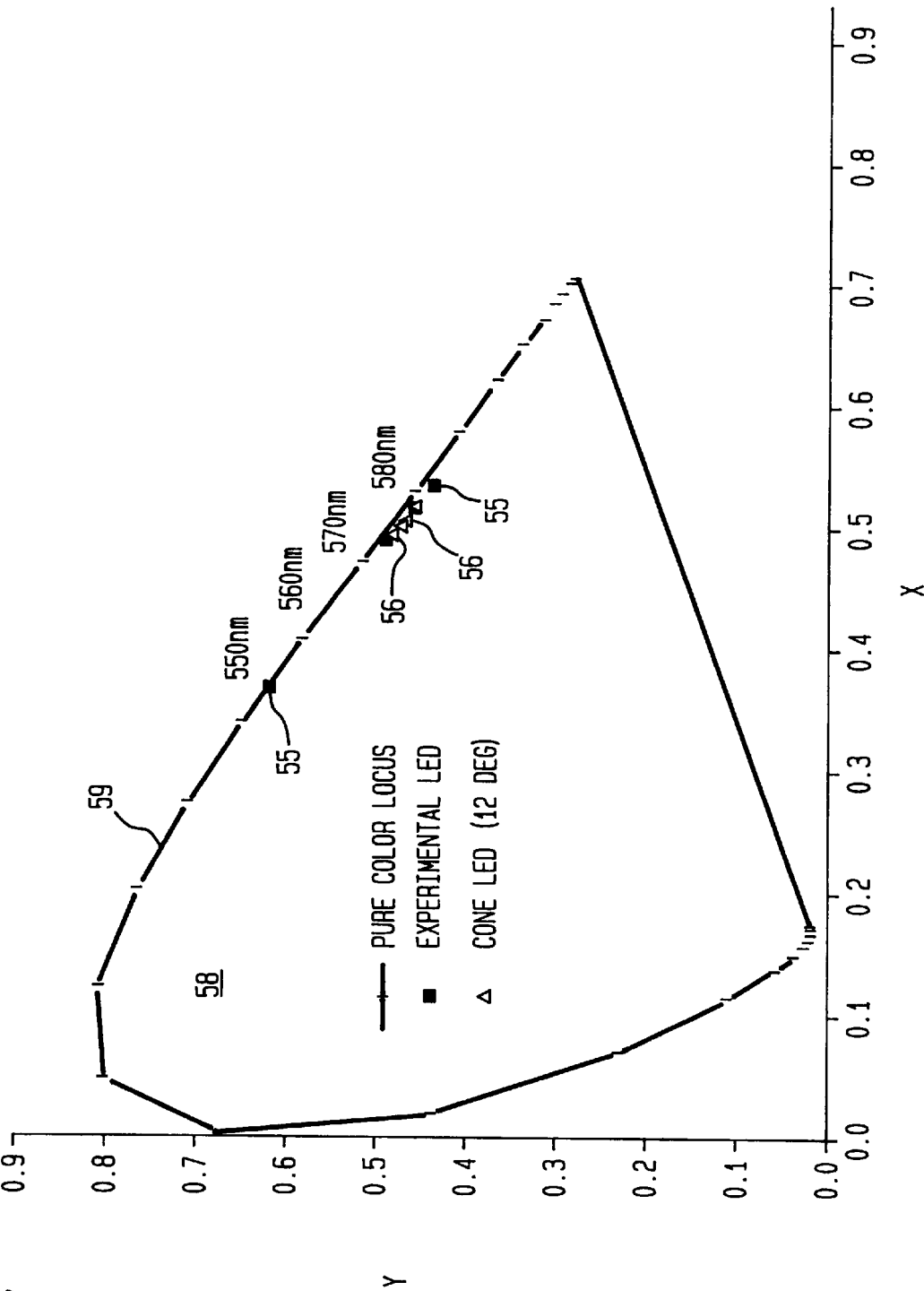

FIG. 5C shows a CIE chromaticity plot of angular dependence for various LEDs disclosed herein. The accepted system for quantifying color perception is the CIE representation in terms of chromaticity coordinates X, Y and Z which are designed to approximate human visual pigment responses. See, e.g., *Colorimetry*, 2nd edition, CIE Publication 15.2, Vienna, Austria (1986). The response to any spectrum can be reduced to these coordinates and the similarity between two sets of spectra can be measured.

In the CIE plot of FIG. 5C, normalized x and y coordinates are plotted with z determined by the normalization x+y+z=1. Pure monochromatic colors fall along the plotted locus 59 and superpositions therefore fall inside the bordered area 54 defined by the locus. The spectra of the planar LED of FIGS. 1–3 are indicated by the filled squares 55. The dispersion reflects the perceived color variation with angle. It is noted that points for an analogous green Alq microcavity device with identical structure other than filler layer thickness would be more closely spaced, indicating that angle variation is less of a problem in this case. This is because the human eye is less sensitive to wavelength changes in the upper part of the CIE phase space, as documented by human perception experiments. See, e.g., D. L. MacAdam, J. Opt. Soc. Am. 32, 247 (1942).

Also plotted in FIG. 5C are the computed results (data points 56) in CIE space for the conical LED 40, with 12 degree wedge angle. The same microcavity layer structure 15 as the planar LED 10 was used, except that an extra 3 nm filler layer thickness was added to compensate for the slight blue shift at 0° viewing angle associated with the cone structure. The plotted data points for both cases are for viewing angles θ(or θ' for the conical case) of 0, 15.8, 25.2 and 45 degrees.

Figure 6B:
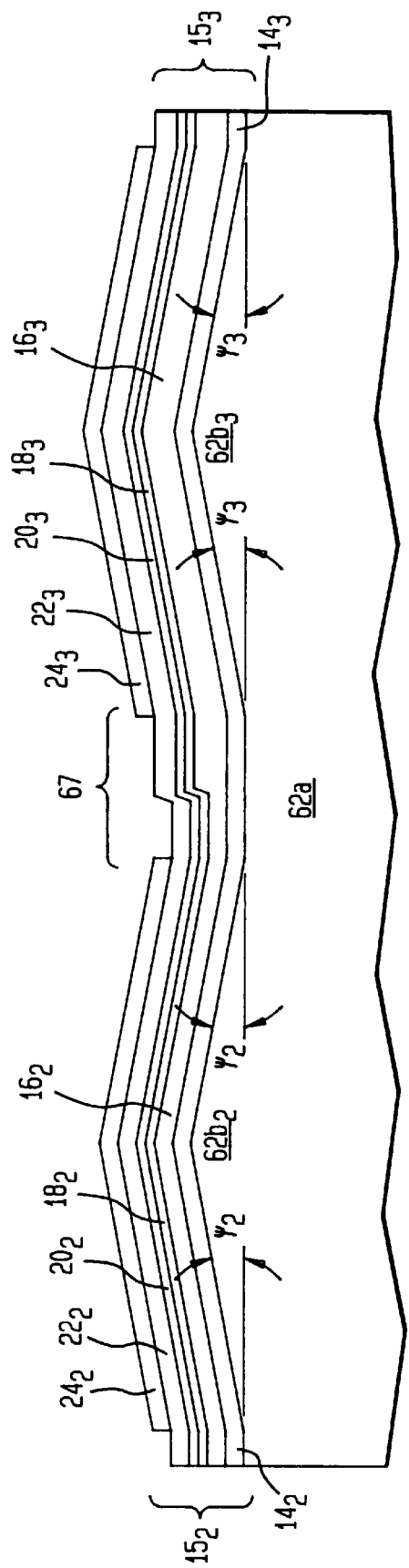
FIG. 6B is the cross-sectional view BB of FIG. 6A.

FIG. 6A shows a portion of a display 60, which is comprised of LED microcavity structures $15_1$–$15_4$ fabricated on a common substrate 62, e.g., fused silica. Substrate 62 has a solid rectangular base 62a and a plurality of conical portions atop the base 62a. Each LED structure $15_i$ overlays an associated one of these conical portions. This is shown more clearly in the cross-sectional view BB of FIG. 6B (bisecting the cones associated with multicavity structures $15_2$ and $15_3$), where conical portions $62b_2$ and $62b_3$ of substrate 62 are shown. The substrate 62 can be fabricated with such conical structures by stamping the silica from a mold. The stamping mold can be made, for example, by etching the reverse conical structures in a semiconductor and then metallizing it. Alternatively, for relative large conical or other non-planar structures, the substrate may be machined directly to form the structures. Microlens arrays may be appropriate substrates and are available commercially.

With continuing reference to FIGS. 6A and 6B, each LED structure $15_i$ is grown on an associated one of the substrate's conical portions $62b_i$ to form a sub-pixel. Each LED structure $15_i$ is designed to emit a specific color, which may be accomplished by utilizing a different $Si_xN_y$ filler layer $16_i$ for each LED. Varying only the filler layer to realize the different color sub-pixels has manufacturing advantages in that the same organic active layer can be used for each sub-pixel. For example, three clustered LEDs such as $15_1$–$15_3$ can together comprise a pixel, with each sub-pixel designed to emit one of the primary colors red, green or blue. As such, any color can be generated by the overall pixel with appropriate biasing and superposition of the three primary colors. It is noted that the wedge angle $\psi_i$ used for each sub-pixel type (each type being associated with a given color) may be different. The extent of the emission wavelength variation with viewing angle is generally different for each color in planar microcavity LEDs and thus, the wedge angles can be tailored to minimize the variation for each sub-pixel type. Each sub-pixel may be defined by either the circular base of the associated conical portion $15_i$ or by a square platform with sides S (as defined by dotted lines 65) including one conical portion $15_i$. Each side S may be on the order of 100 micrometers long, for example. A typical display comprises thousands of pixels with each pixel comprised of three or four sub-pixels.

The diameter of each conical portion $62_i$ of the substrate is typically slightly less than the length of the associated sides S. In the regions 67 between the conical LEDs, at least the top mirror layer 24 is absent, such that the individual microcavity structures $15_i$ are electrically separated. This is accomplished by patterning the mirror layer 24, e.g., by masking the regions 67 prior to the layer 24 deposition or by photolithography and etching of layer 24.

Preferably, at least the transparent electrode layer 18 remains in the regions 67 to facilitate the biasing of the individual sub-pixels. Thus, a large sheet of ITO can be used in the area comprising either the entire display or large strips of the display. This sheet or set of strips would then comprise the ITO layer 18 for hundreds or thousands of sub-pixels, and is maintained at a constant reference potential to facilitate biasing. For ease of manufacturing, the other layers (aside from the top mirror) of LED structures $15_i$ are also preferably present in the regions 67 and are deposited as large sheets of material. Such is the configuration shown in FIG. 6B, where it is seen that only the top mirror layers $24_2$ and $24_3$ are discontinued in region 67 between the microcavities $15_2$ and $15_3$. Also, in this example, filler layers $16_2$ and $16_3$ are of different thicknesses. As such, with the other layers being of essentially the same material and thicknesses, the two microcavities produce different colors. (It is noted that in FIG. 6B, the thicknesses of the layers of microcavity structures $15_2$ and $15_3$ are exaggerated with respect to the size of the conical portions, for clarity).

The thickness of the filler layer typically is in the range of 50–2000 nm. The filler layer may actually be absent in one of the LED microcavities $15_i$ of each pixel (i.e., the filler layer thickness may be zero in one of the microcavities). Typically, a filler layer of essentially constant thickness is formed on the bottom mirror 14, e.g., by spin coating and baking of polyimide, followed by patterning by appropriate means, e.g., photolithography and etching. The purpose of the patterning is to provide optical cavities differing in their optical length such that different colors can be produced.

The sub-pixels can be biased by a conventional means in which the electrode layer 18 is held to a common reference potential and voltages are selectively applied to the top mirror layer $24_i$ of each microcavity structure $15_i$. The sub-pixels can thus be excited at appropriate times to create any desired image on the display. Any appropriate circuitry can be used to drive the sub-pixels. See, for instance, K. Murata, *Display Devices*, pp. 47–50, 1992, incorporated by reference. At page 49, FIG. 9a of this reference, a matrix driving circuit is disclosed which could be used in a display according to the present invention.

Figure 7:
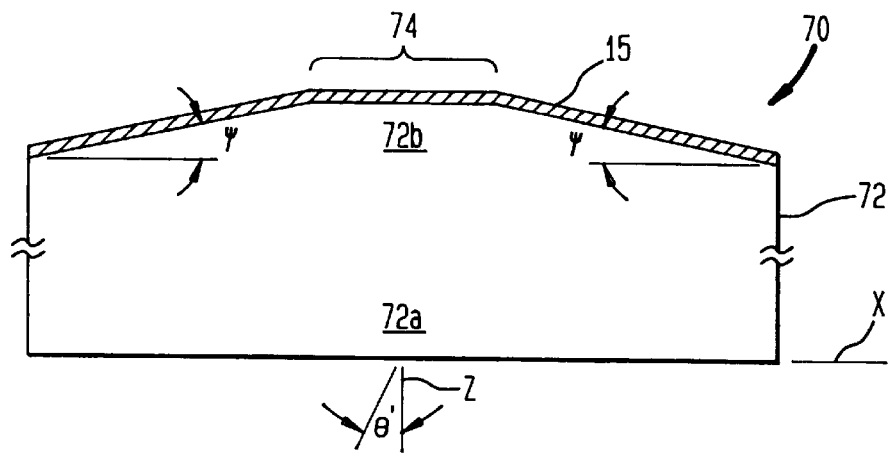
FIGS. 7–9 are cross-sectional views of alternate embodiments of the present invention.

Referring to FIG. 7, an alternate embodiment of the present invention is the light emitter 70, shown in a cross-sectional view. A substrate 72 is fabricated with a solid rectangular base portion 72a and a top portion 72b in the shape of a truncated cone (frustum). LED layer structure 15 is then formed on the top portion 72b to provide an LED in the shape of a frustum with a flat top 74. The LED layers of layer structure 15 are essentially the same as those used for the conical light emitter 40. The wedge angle ψ of the frustum may be in the range of 8°–15°. As in the conical case, the emission wavelength variation with viewing angle θ' is reduced as compared to the planar light emitter of FIG. 1. The truncation point on the frustum, which defines the area of the flat surface 74, can be optimized empirically or analytically.

Figure 8:
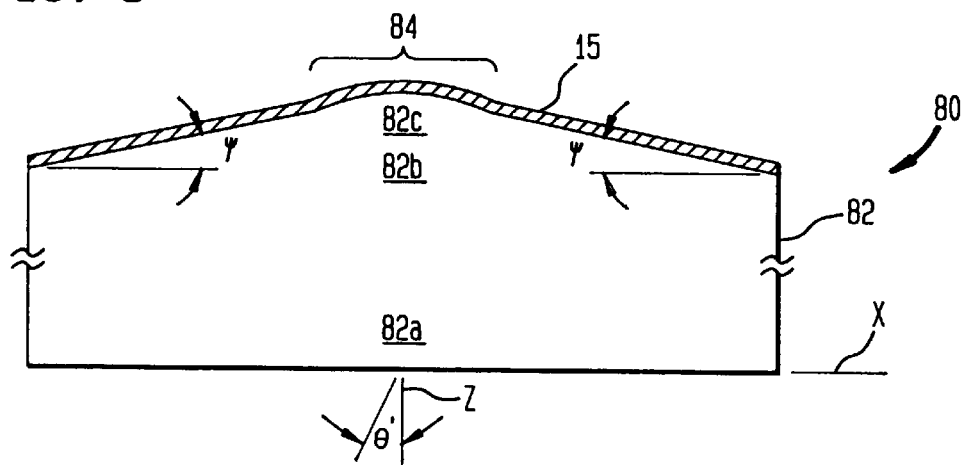

FIG. 8 shows another light emitter 80 in accordance with the present invention, which also affords improved emission wavelength variation with viewing angle. Light emitter 80 is similar to the frustum type emitter 70, except that a dome-shaped top portion 84 replaces the flat top 74. A substrate 82 is comprised of a base portion 82*a*, a frustum portion 82*b* and a dome portion 82*c* atop the frustum portion. The dome portion 82*c* is preferably spherical; however, it is understood that other symmetric shapes are possible. LED layer structure 15 is grown on the frustum and dome portions of the substrate. The truncation point of the frustum portion 82*b*, the shape of the dome portion 82*c*, and the frustum wedge angle ψ (typically between 8°–15°) can be varied empirically or analytically to optimize the emission wavelength with viewing angle for a given LED layer structure 15.

Figure 9:
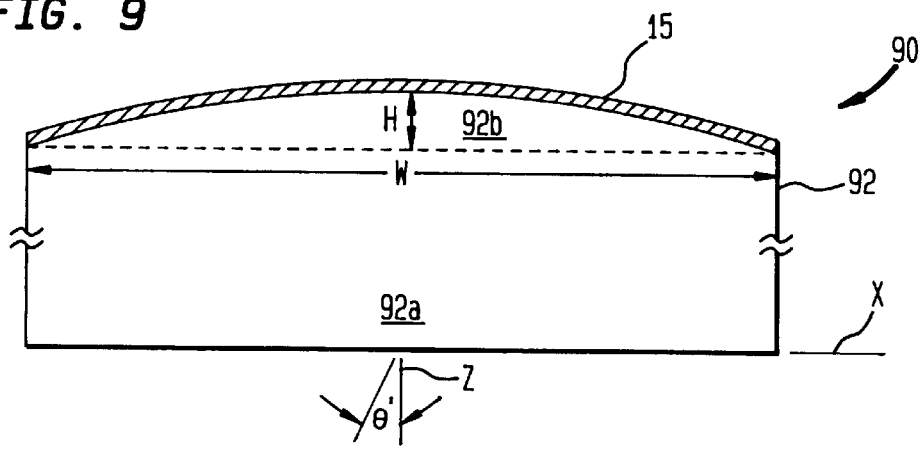

Referring to FIG. 9, another alternative embodiment of the present invention is the light emitter 90. A substrate 92 is fabricated with a solid rectangular base portion 92*a* and a dome portion 92*b* which may be a shallow arc of a sphere. For example, a height H of 20 microns may be used in conjunction with a width W of 100 microns for the dome 92*b*. LED layer structure 15 is uniformly grown on the dome. For given LED layer compositions and thicknesses, the shape of the dome 92*b* can be varied to desensitize the emission wavelength with viewing angle as compared to the planar LED case.

It is understood that a plurality of any of the light emitters 70, 80 and 90 of FIGS. 7–9 can be fabricated on a common substrate to form a display in an analogous fashion as was described in reference to the display of FIGS. 6A–6B. It is also possible to form each pixel with differently shaped sub-pixels. For example, light emitter 80 may be used for one color while light emitter 70 may be used for another color, such that each pixel will have at least one sub-pixel as emitter 70 and at least one sub-pixel as emitter 80.

Computational Procedure

The EL intensity and spectrum of light emitted from an organic microcavity structure as a function of viewing angle from the structure, can be computed based on the factors set forth below. The computation is for a microcavity structure disposed on a planar substrate such as that shown in FIG. 1. The EL intensity and spectrum for an LED having the same microcavity structure disposed on a symmetric, non-planar substrate, such as in the embodiments of FIGS. 4–9, can then be determined in any plane by adding the computed contributions from both halves of the symmetrical structure. For example, the result shown in FIGS. 5(A–C) for the conical-type LED case was obtained based on this approach.

FACTOR I: molecular emission versus wavelength. This is measured by photoluminescence or by measuring the emission that the organic layers would provide in a non-cavity LED. In general, the molecular emission is a very broad distribution as a function of wavelength. (For organic materials that have narrow molecular emission, e.g., <~10 nm, the angular remediation scheme herein would not be as useful, since the color cannot change much with viewing angle in this case anyway).

FACTOR II: enhancement of the density of states in the cavity relative to free space. This is described by the magnitude and frequency dependence of the cavity finesse, which is defined as free spectral range (mode spacing) divided by cavity mode width. For example, the finesse at a viewing angle of zero degrees (perpendicular to the device layers) is calculated from the formula:

$$F = \frac{\pi (R_1 R_2)^{1/4}}{1 - (R_1 R_2)^{1/2}} \quad (1)$$

where the cavity mirror reflectivities $R_1$ and $R_2$ are determined using the Fresnel equations as given in M. Born and E. Wolf, "Principles of Optics", Pergamon Press, Norwich 1975 (5th Edition) pps. 40–49, 55–70. The frequency dependence is Lorentzian with a spectral width and center frequency given by the cavity mode width and resonance position. These are calculated by applying a transfer matrix formalism to the entire LED multilayer structure. A transfer matrix formalism is described in G. Bjork and O. Nilsson, "New Matrix Theory of Complicated Laser Structures", Jnl. of Lightwave Technology, Vol. LT-5, No. 1, January 1987, pp. 143–146. It is noted that the density of states enhancement depends not only on wavelength but on the direction in which the light is emitted.

FACTOR III: the position of the emissive region relative to the peaks and troughs of the field in the cavity mode. The field pattern at a given wavelength and for a given emission direction is also calculated from the transfer matrix formalism. The value at the emissive layer relative to the antinode is easily determined.

FACTOR IV: the fraction of the emitted light which actually escapes the LED (i.e., which travels through the dielectric stack mirror). This is given by $$\frac{(1 + \sqrt{R_2})^2 (1 - R_1)}{(1 - (R_1 R_2)^{1/2})^2}, \quad (2)$$

an expression which also includes the finesse factor II. See E. F. Schubert et al., infra.

Figure 10:
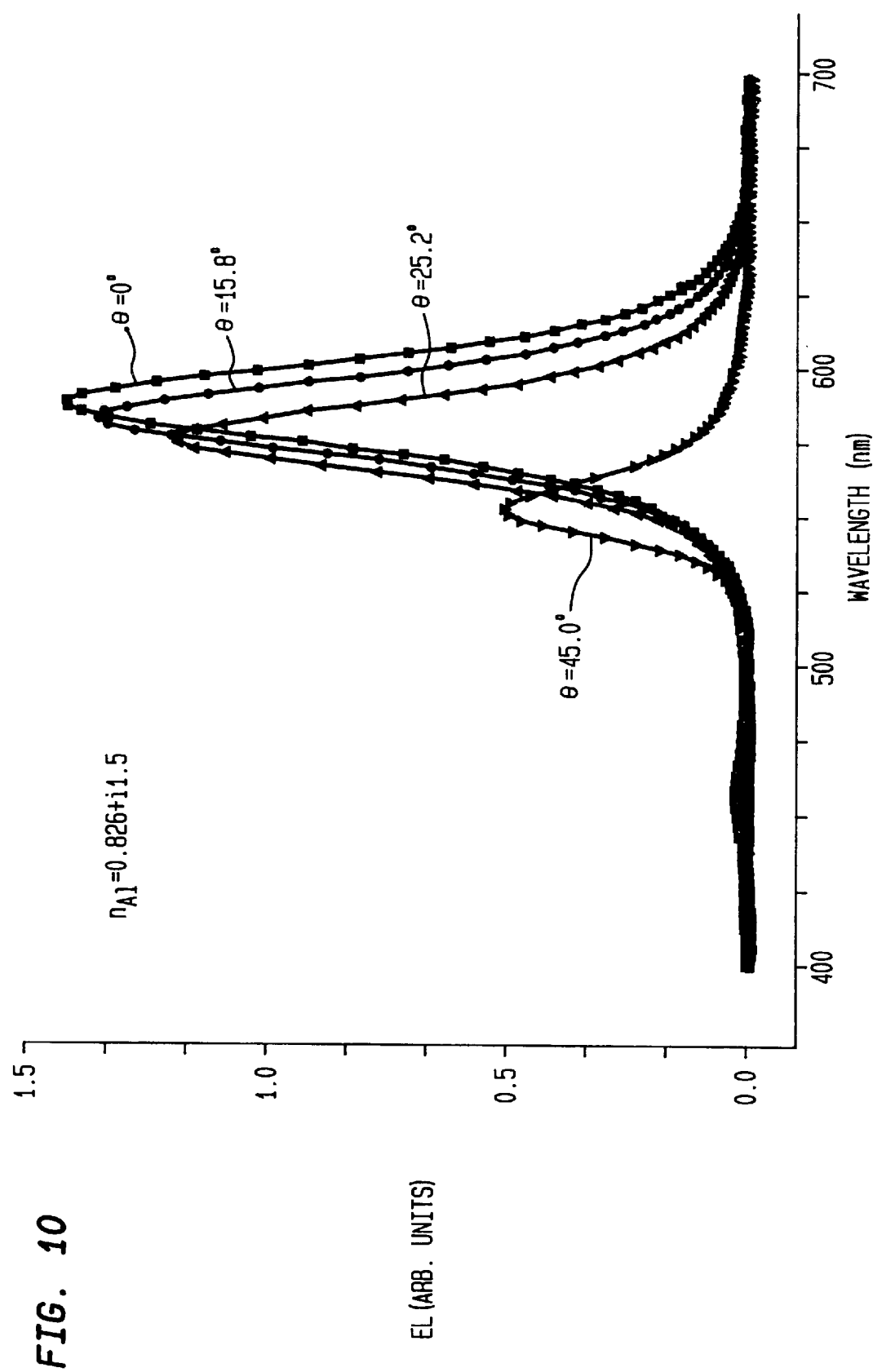
FIG. 10 is the calculated intensity of the emitted light versus wavelength for the light emitter of FIGS. 1–2 for a number of viewing angles.

FACTOR V: the molecular lifetime reduction caused by the cavity. This has been found to be fairly small experimentally. The result can vary slightly if the molecules in the sample have varying emission spectra. The calculation can be performed by averaging the molecular emission rate over all directions including those where the light is totally internally reflected and does not escape the device. (See, e.g., Vredenberg et al., Phy. Rev. Lett. 71, 517 (1993).) Computations based on the above five factors of EL intensity and spectrum as a function of viewing angle from a planar microcavity device have been found to be in close agreement with measured results. For example, FIG. 10 shows computed EL intensity and spectrum for the LED 10 of FIG. 1 having the layer characteristics given in FIG. 2. The reflectivity of the Al layer 24 was assumed to be 0.826+i1.5. The results show close agreement with the measured results shown in FIG. 3. As noted, computed results for microcavity LEDs fabricated on non-planar substrates in accordance with the present invention can be obtained by adding the results from various regions of the device. The conical case is the easiest to analyze in that the two halves of the case can be approximated as planar devices in any plane. The results presented above in FIG. 5 were based on this approach. Microcavity structures fabricated on dome-like substrate surfaces can be analyzed by integration in any plane of the far field contributions of each region of the curved dome-like surface.

Although microcavity LEDs in accordance with the present invention are particularly useful in color displays, they are also useful in other applications. For example, the LEDs can be used in a transmitter in optical interconnect means or in optical fiber communication means, or in a print head in an LED printer means. Such means will differ from the corresponding prior art means substantially only with respect to the light sources.

It will be understood that various modifications can be made to the various embodiments of the present invention herein disclosed without departing from its spirit and scope. As noted above, for example, various geometrical configurations of a surface of the substrate are contemplated in order to minimize the blue shift of the microcavity electroluminescent device. Also, there are a wide range of choices of the number of layers, materials and characteristics of the material that can make up a microcavity electroluminescent device. All combinations would fall within the scope of the present invention. Similarly, various modifications may be made to the above-described invention in method without departing from its spirit and scope. As noted, a mathematical model of the device may be used to refine and/or verify a design of a microcavity EL device that is intended to minimize the blue shift, or it may be used to create the design itself. Therefore the above description should not be construed as limiting the invention but merely as presenting preferred embodiments of the invention. Those skilled in the art will envision other modifications within the spirit and scope of the present invention as defined by the claims presented below.

What is claimed is:

1. An electroluminescent device, comprising:
   a substrate having a surface with a multiplicity of predetermined regions, at least one of the regions comprising a symmetric, non-planar surface feature;
   a first layer of reflective material disposed on said non-planar surface feature;
   a second layer of reflective material; and
   an active layer having organic material capable of electroluminescence disposed between said first and second reflective layers, said active layer and said reflective layers forming a microcavity structure.

2. The electroluminescent device according to claim 1, wherein the substrate has a planar surface opposite the symmetric, non-planar surface feature.

3. The electroluminescent device according to claim 2, wherein the symmetric, non-planar surface feature of the substrate is a cone having an apex extending away from the opposite planar surface of the substrate.

4. The electroluminescent device according to claim 3, wherein the cone has a wedge angle between about 8° and about 15°.

5. The electroluminescent device according to claim 1, further comprising means for facilitating application of an electric field across the active layer such that said microcavity structure can be caused to emit light through said substrate.

6. The electroluminescent device according to claim 2, wherein the symmetric, non-planar surface feature of the substrate is a frustum extending away from the opposite planar surface of the substrate.

7. The electroluminescent device according to claim 2, wherein the symmetric, non-planar surface feature of the substrate comprises:
   a frustum portion extending away from the opposite planar surface of the substrate; and
   a dome-like portion atop the frustum portion.

8. The electroluminescent device according to claim 7, wherein the dome-like portion is spherical.

9. The electroluminescent device according to claim 2, wherein the symmetric, non-planar surface feature of the substrate comprises a dome-like surface concave with respect to the opposite planar surface of the substrate.

10. The electroluminescent device according to claim 9, wherein the dome-like surface is spherical.

11. The electroluminescent device according to claim 1, wherein the geometry of the symmetric, non-planar surface feature of the substrate is such as to provide a reduction in emission wavelength variation as a function of viewing angle from the device, as compared to a planar microcavity light emitter having a microcavity layer structure with layers of the same compositions and thicknesses.

12. The electroluminescent device according to claim 5, wherein:
   said substrate is selected from the group consisting of silica, glass, sapphire, quartz and transparent plastic;
   said first layer of reflective material is a dielectric stack of alternating silicon dioxide and silicon nitride layers or alternating $SiO_2$ and $TiO_2$ layers;
   said second reflective layer is selected from the group consisting of Al, Ag, alloys of Mg and Ag, alloys of Mg and Al, and alloys of Li nd Al; and
   said means for facilitating application an electric field across the active layer comprises an indium tin oxide or polyaniline layer.

13. The electroluminescent device according to claim 12, further comprising a filler layer disposed between said active layer and said dielectric stack, a hole transport layer and an electron transport layer.

14. The electroluminescent device according to claim 3, wherein the peak wavelength emitted by the microcavity electroluminescent device normal to the planar surface of the substrate varies by less than about 6 nm from the peak wavelength emitted 45° from the normal to the planar surface of the substrate.

15. The electroluminescent device according to claim 1, wherein the organic material capable of electroluminescence is selected from the group consisting of Alq, perylene derivatives, anthracene, poly(phenylene vinylenes), oxadiazole or stilbene derivatives, and any of the foregoing doped with a dopant selected from the group consisting of coumarines, DCM, and rhodamine derivatives.

16. A display, comprising:
   a substrate having a planar surface on one side and an opposing surface having a plurality of non-planar, symmetric projecting surface features; and
   a plurality of organic microcavity layer structures, each formed on one of said projecting surface features and each defining a light emitting device (LED), each said layer structure including a first layer of reflective material disposed on the associated projecting surface; a second layer of reflective material; and an active layer having organic material capable of electroluminescence disposed between said first and second reflective layers.

17. The display according to claim 16, wherein at least some of said projecting surface features are cones.

18. The display according to claim 16, wherein each of said active layer and said first reflective layer are substantially continuous throughout said display, said second reflective layer being patterned to define individual ones of said LED's.

19. The display according to claim 18, wherein:
   at least three adjacent ones of said LEDs form a pixel of said display, with each said adjacent LED of a given pixel capable of emitting a different color;
   each said adjacent LED of a given pixel having a color controlling filler layer of a thickness different from that of the other of said adjacent LEDs of said given pixel; and
   said active layer of each said adjacent LED of a given pixel having substantially the same material and thickness such that a different color can be emitted by each said adjacent LED of a given pixel when biased.

20. The display according to claim 16, wherein the geometry of each of said symmetric, non-planar projecting surface features are such as to provide a reduction in emission wavelength variation as a function of viewing angle from the projecting surface feature, as compared to a planar microcavity light emitter having a microcavity layer structure with layers of the same compositions and thicknesses.

* * * * *